US012757712B2

(12) United States Patent
Gao

(10) Patent No.: US 12,757,712 B2
(45) Date of Patent: Oct. 6, 2026

(54) SEMICONDUCTOR STRUCTURE AND METHOD FOR MANUFACTURING SAME

(71) Applicant: CHANGXIN MEMORY TECHNOLOGIES, INC., Hefei City (CN)

(72) Inventor: Yuanhao Gao, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 600 days.

(21) Appl. No.: 18/320,235

(22) Filed: May 19, 2023

(65) Prior Publication Data

US 2023/0307354 A1 Sep. 28, 2023

Related U.S. Application Data

(63) Continuation of application No. PCT/CN2022/083040, filed on Mar. 25, 2022.

(30) Foreign Application Priority Data

Jan. 12, 2022 (CN) ......................... 202210031093.9

(51) Int. Cl.

| | |
|---|---|
| ***H10W 20/42*** | (2026.01) |
| ***H10W 20/00*** | (2026.01) |
| ***H10W 20/43*** | (2026.01) |

(52) U.S. Cl.
CPC ......... *H10W 20/42* (2026.01); *H10W 20/056* (2026.01); *H10W 20/087* (2026.01); *H10W 20/089* (2026.01); *H10W 20/43* (2026.01)

(58) Field of Classification Search
CPC ... H10W 20/42; H10W 20/43; H10W 20/087; H10W 20/056; H10W 20/089; H10W 20/076; H10W 20/023; H10W 20/081
See application file for complete search history.

(56) References Cited

U.S. PATENT DOCUMENTS

| | | | | |
|---|---|---|---|---|
| 7,056,821 | B2 | 6/2006 | Yang | |
| 7,259,089 | B2 | 8/2007 | Kanamura | |
| 10,332,787 | B2 | 6/2019 | Wu | |
| 2005/0158982 | A1 | 7/2005 | Kanamura | |
| 2006/0040498 | A1* | 2/2006 | Yang | H01L 21/76811 257/E21.579 |

(Continued)

FOREIGN PATENT DOCUMENTS

| | | | |
|---|---|---|---|
| CN | 103943559 | A | 7/2014 |
| CN | 109148358 | A | 1/2019 |
| KR | 20040000700 | A | 1/2004 |

OTHER PUBLICATIONS

International Search Report in the international application No. PCT/CN2022/083040, mailed on Aug. 5, 2022, 7 pages.

*Primary Examiner* — John M Parker
(74) *Attorney, Agent, or Firm* — Syncoda LLC; Feng Ma

(57) ABSTRACT

A method for manufacturing method semiconductor includes: providing a base; forming an annular sacrificial blocking layer in the base; forming an etched hole in the base, in which the etched hole is located at an inner side of the annular sacrificial blocking layer; and removing the annular sacrificial blocking layer to obtain an interconnecting hole, in which a width of an upper part of the interconnecting hole is greater than a width of a lower part of the interconnecting hole.

7 Claims, 20 Drawing Sheets

(56) References Cited

U.S. PATENT DOCUMENTS

| | | | | |
|---|---|---|---|---|
| 2006/0194426 | A1 | 8/2006 | Yang | |
| 2008/0227288 | A1 * | 9/2008 | Chen | H10P 50/73 257/E21.256 |
| 2011/0115047 | A1 * | 5/2011 | Hebert | H01L 21/743 257/E29.174 |
| 2013/0193585 | A1 * | 8/2013 | Lin | H10P 50/694 257/774 |
| 2017/0229345 | A1 * | 8/2017 | Liou | H01L 21/76813 |
| 2018/0374744 | A1 | 12/2018 | Wu et al. | |
| 2019/0393156 | A1 * | 12/2019 | Zierath | C22C 19/00 |
| 2020/0273780 | A1 * | 8/2020 | Park | H01L 23/481 |
| 2022/0130736 | A1 * | 4/2022 | Shih | H01L 21/76898 |

* cited by examiner

SEMICONDUCTOR STRUCTURE AND METHOD FOR MANUFACTURING SAME

CROSS-REFERENCE TO RELATED APPLICATIONS

The present application is a U.S. continuation application of International Application No. PCT/CN2022/083040, filed on Mar. 25, 2022, which claims priority to Chinese Patent Application No. 202210031093.9, filed on Jan. 12, 2022. International Application No. PCT/CN2022/083040 and Chinese Patent Application No. 202210031093.9 are incorporated herein by reference in their entireties.

BACKGROUND

A through silicon via (TSV) technology is a high-density packaging technology, gradually replaces a wire bonding technology that is mature at present, and is considered as a fourth generation packaging technology. The through silicon via technology can effectively shorten the length of an interconnecting wire between chips by a vertical interconnection, which reduces the signal delay, thereby improving the signal transmission performance and the working frequency of an electronic system, increasing its broadband and realizing the miniaturization of device integration, which is an important direction of semiconductor technology development in the future.

At present, the through silicon via technology is widely used in three-dimensional packaging technology to realize the interconnection between chips. By filling conductive materials such as copper, tungsten or polysilicon, the through silicon via technology realizes a vertical electrical interconnection, signals can be transmitted from one side of a chip to the other side of the chip, and the three-dimensional integration of multi-layer chips by combining with a chip stacking technology is realized.

However, when filling a via hole with a high aspect ratio with a metal, there is a problem that an angle of arrival is small. Because of the small angle at the edge of the via hole and a fast deposition speed of the metal, a problem that the opening of the via hole is prematurely sealed and a void exists in the via hole is caused.

SUMMARY

According to various embodiments of embodiments of the disclosure, a semiconductor structure and a method for manufacturing the same are provided.

According to some embodiments, an aspect of embodiments of the disclosure provides a method for manufacturing a semiconductor structure, which includes:

providing a base;

forming an annular sacrificial blocking layer in the base;

forming an etched hole in the base, in which the etched hole is located at an inner side of the annular sacrificial blocking layer; and removing the annular sacrificial blocking layer to obtain an interconnecting hole, in which a width of an upper part of the interconnecting hole is greater than a width of a lower part of the interconnecting hole.

According to some embodiments, another aspect of embodiments of the disclosure provides a semiconductor structure, which includes:

a base; and an interconnecting hole located in the base, in which a width of an upper part of the interconnecting hole is greater than a width of a lower part of the interconnecting hole.

BRIEF DESCRIPTION OF THE DRAWINGS

Embodiments of the disclosure relate to a technical field of semiconductors, and in particular to a semiconductor structure and a method for manufacturing the same.

In order to more clearly illustrate the technical solutions of the embodiments of the disclosure, the drawings used in the description of the embodiments will be briefly introduced herein below. Apparently, the drawings in the following description are some embodiments of the embodiments of the disclosure, and for those of ordinary skill in the art, drawings of other embodiments can be obtained according to these drawings without making creative efforts.

FIG. 15 also shows a schematic cross-sectional structural diagram of a semiconductor structure provided in another embodiment of embodiments of the disclosure.

DETAILED DESCRIPTION

Figure 1A:
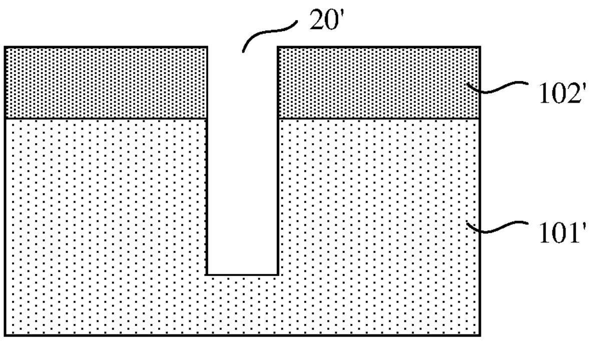
FIG. 1A shows a schematic cross-sectional structural diagram of a semiconductor structure in one embodiment of embodiments of the disclosure.

In order to facilitate understanding the embodiments of the disclosure, the embodiments of the disclosure will be described more comprehensively hereinafter with reference to the corresponding drawings. Preferred embodiments of the disclosure are shown in the drawings. However, the embodiments of the disclosure may be implemented in many different forms and are not limited to the embodiments described herein. In contrast, these embodiments are provided to make the disclosure of the embodiments of the invention more thorough and comprehensive.

Unless otherwise defined, all technical and scientific terms used herein have the same meaning as commonly understood by those skilled in the art to which the embodiments of the disclosure belong. Terms used herein in the specification of the embodiments of the disclosure are for the purpose of describing specific embodiments only and are not intended to limit the embodiments of the disclosure. The term "and/or" as used herein includes any and all combinations of one or more related listed items.

It should be understood that while an element or a layer is referred to as being "on . . . ", "connected to . . . " or "coupled to . . . " other elements or layers, it may be directly on the other elements or layers, connected or coupled to the other elements or layers, or an intermediate element or layer may be present. In contrast, while the element is referred to as being "directly on . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the embodiments of the disclosure, a first element, component, region, layer or section discussed below may be represented as a second element, component, region, layer or section.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the embodiments of the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

Please refer to FIGS. 1 to 15. It should be noted that the diagrams provided in the embodiments only show the basic conception of the embodiments of the disclosure in a schematic manner. Although the diagrams only show the components related to the embodiments of the disclosure and are not drawn according to the number, shape and size of the components in actual implementation, the form, quantity and proportion of the components in the actual implementation may be arbitrarily changed, and the layout form of the components may be more complex.

At present, the through silicon via technology is widely used in three-dimensional packaging technology to realize the interconnection between chips. By filling conductive materials such as copper, tungsten or polysilicon, the through silicon via technology realizes a vertical electrical interconnection, signals can be transmitted from one side of a chip to the other side of the chip, and the three-dimensional integration of multi-layer chips by combining with a chip stacking technology is realized.

Figure 1B:
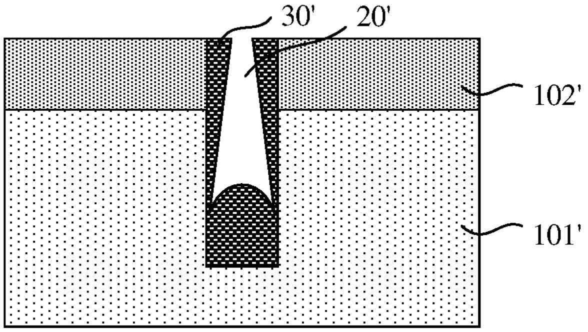
FIG. 1B shows a schematic cross-sectional structural diagram of a structure shown in FIG. 1A when it is filled with a metal.
Figure 1C:
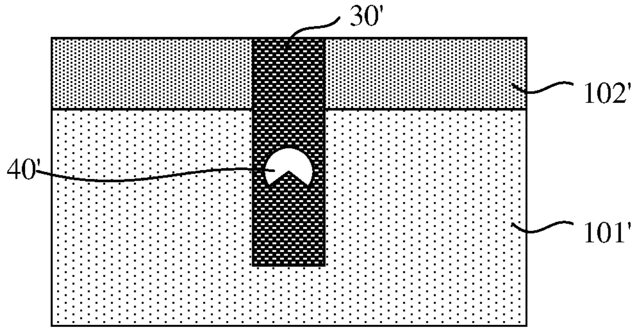
FIG. 1C shows a schematic cross-sectional structural diagram of a structure obtained after a structure shown in FIG. 1A is filled with a metal.

However, when filling a via hole with a high aspect ratio with a metal, there is a problem that an angle of arrival is small. Because of the small angle at the edge of the via hole and a fast deposition speed of the metal, a problem that the opening of the via hole is prematurely sealed and a void exists in the via hole is caused. Taking the structure as shown in FIG. 1A as an example, the structure includes: a substrate 101'; a dielectric layer 102' located on a surface of the substrate 101'; and a via hole 20' penetrating through the dielectric layer 102' and extending into the substrate 101', and the via hole 20' has a high aspect ratio. As shown in FIG. 1B, when a metal material layer 30' is deposited in the via hole 20', because of a small angle at the edge of the via hole 20' and a fast deposition speed of the metal material layer 30', an opening of the via hole 20' is prematurely sealed. As shown in FIG. 1C, a void 40' exists in the via hole 20'.

Figure 2A:
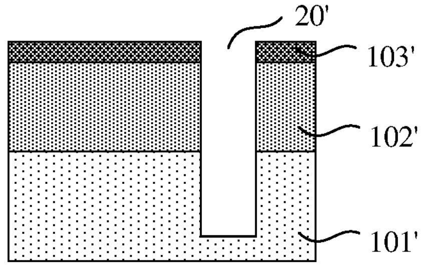
FIG. 2A shows a schematic cross-sectional structural diagram of a semiconductor structure in another embodiment of embodiments the disclosure.
Figure 2B:
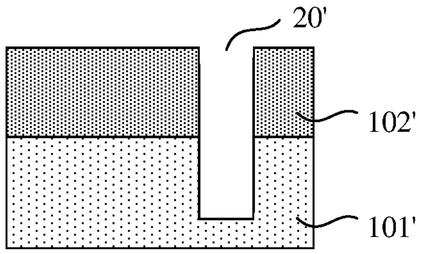
FIG. 2B shows a schematic cross-sectional structural diagram of a structure obtained after removing a mask layer of a structure shown in FIG. 2A.
Figure 2C:
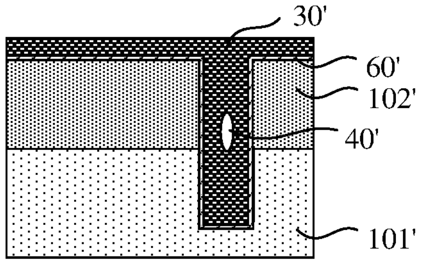
FIG. 2C shows a schematic cross-sectional structural diagram of a structure obtained after depositing a metal material layer in a via hole of the structure shown in of FIG. 2B.
Figure 2D:
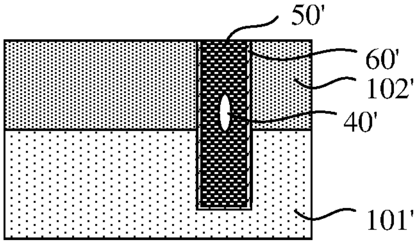
FIG. 2D shows a schematic cross-sectional structural diagram of a structure obtained after removing the metal material layer located on a dielectric layer of the structure shown in FIG. 2C.

More specifically, taking the structure as shown in FIG. 2A as an example, a via hole 20' of the structure is formed based on a mask layer 103' located on a surface of a dielectric layer 102'. The operation shown in FIG. 2B is an operation of removing the mask layer 103'. As shown in FIG. 2C, when a metal material layer 30' is deposited in the via hole 20', because of a small angle at the edge of the via hole 20' and a fast deposition speed of the metal material layer 30', the opening of the via hole 20' is prematurely sealed, and a void 40' exists in the via hole 20'. The operation shown in FIG. 2D is an operation of removing the metal material layer 30' located on the dielectric layer 102' to obtain a metal layer 50' located within the via hole 20'. There may also be a seed layer 60' in the obtained structure.

Figure 3:
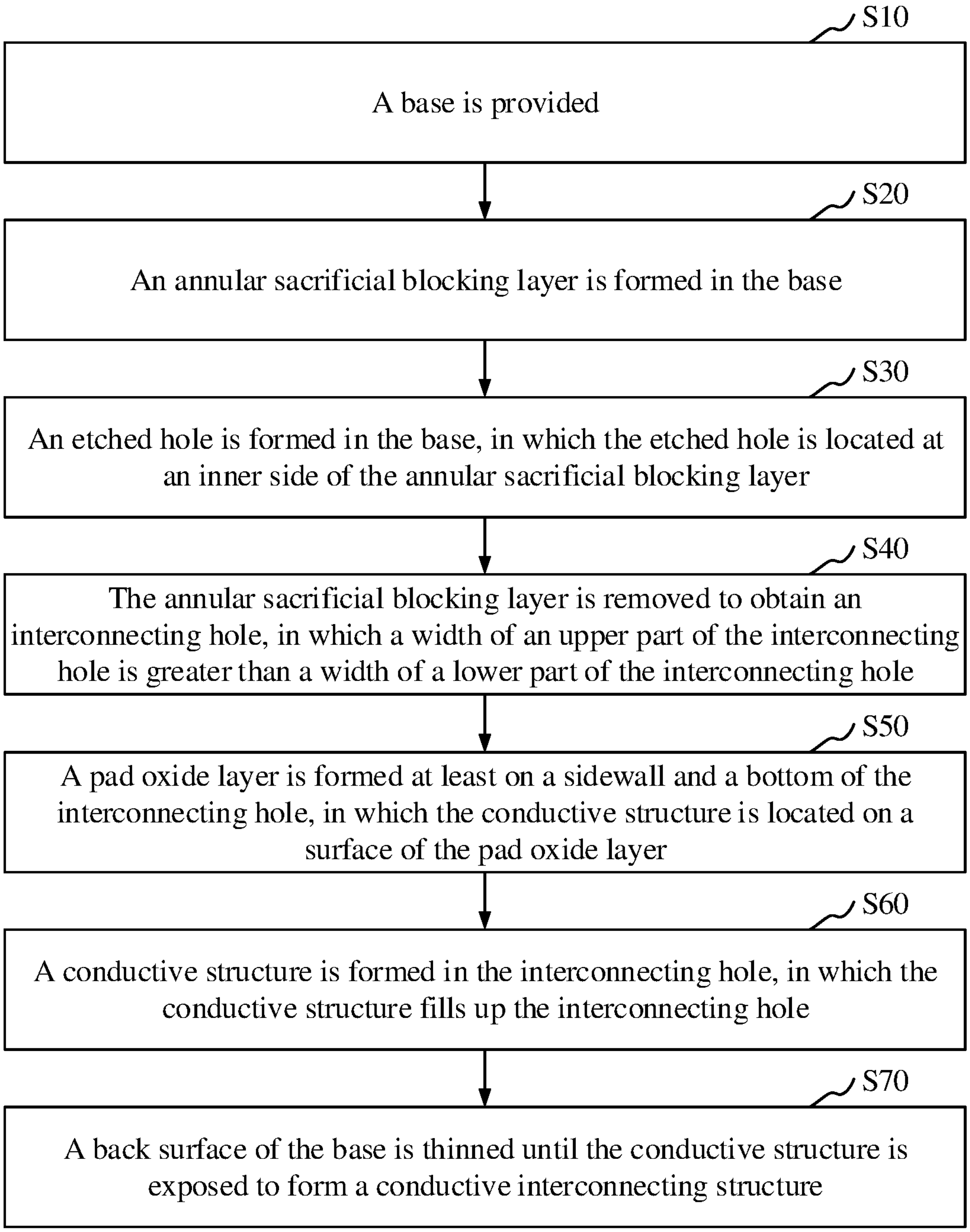
FIG. 3 shows a flowchart of a method for manufacturing a semiconductor structure provided in one embodiment of embodiments of the disclosure.

Referring to FIG. 3, in one embodiment of the embodiments of the disclosure, a method for manufacturing a semiconductor structure is provided, which includes the following operations.

At S10, a base is provided.

At S20, an annular sacrificial blocking layer is formed in the base.

At S30, an etched hole is formed in the base. The etched hole is located at an inner side of the annular sacrificial blocking layer.

At S40, the annular sacrificial blocking layer is removed to obtain an interconnecting hole, in which a width of an upper part of the interconnecting hole is greater than a width of a lower part of the interconnecting hole.

Specifically, continuously referring to FIG. 3, by setting the width of the upper part of the interconnecting hole to be greater than the width of the lower part the interconnecting hole, an opening of the interconnecting hole can avoid from being prematurely sealed when filling a conductive layer in the subsequent process, thereby obtaining a conductive structure without a void.

Figure 4:
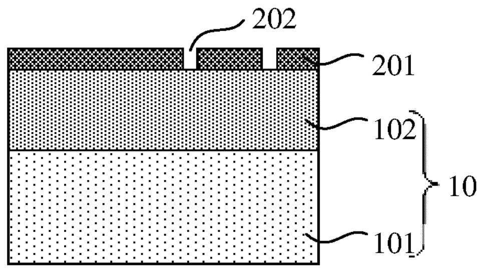
FIG. 4 shows a schematic cross-sectional structural diagram of a structure obtained after S201 in a method for manufacturing a semiconductor structure provided in one embodiment of embodiments of the disclosure.

As an example, referring to FIG. 4, at S10, a base 10 may include a substrate 101 and a dielectric layer 102 located on a surface of the substrate 101. The substrate 101 may include but is not limited to any one of a silicon substrate, a sapphire substrate, a glass substrate, a silicon carbide substrate, a gallium nitride substrate, a gallium arsenide substrate, or the like. The dielectric layer 102 may include but is not limited to an oxide layer such as a silicon oxide layer.

As an example, the substrate 101 includes a silicon substrate and the dielectric layer 102 includes a silicon oxide layer.

Specifically, the silicon oxide layer is easy to grow, is stable, and has ideal interface properties with the silicon substrate. Moreover, there is a very good etching selection ratio between the silicon oxide layer and the silicon substrate.

Figure 5:
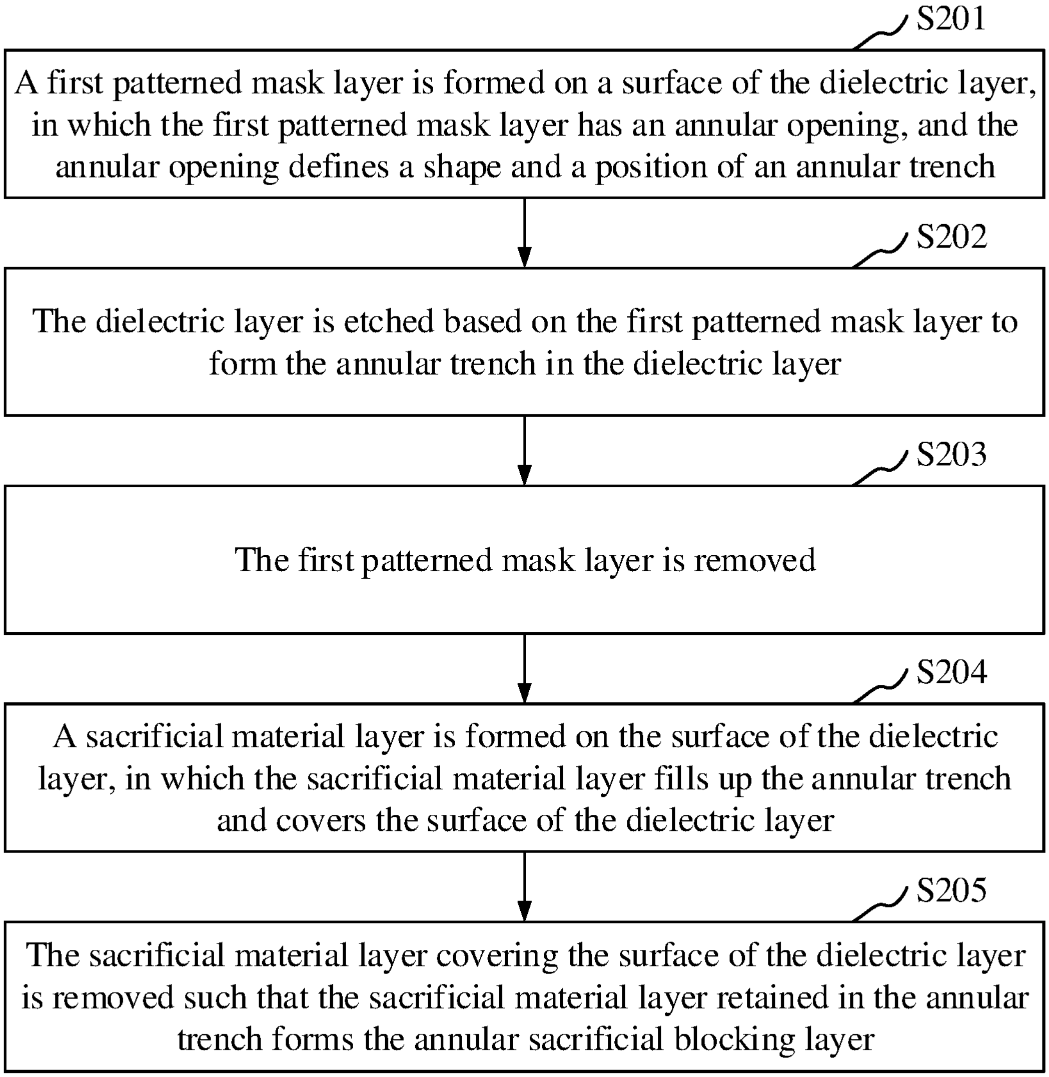
FIG. 5 shows a flowchart of S20 in a method for manufacturing a semiconductor structure provided in one embodiment of embodiments of the disclosure.

For S20, referring to FIG. 5, as an example, S20 may include the following operations.

At S201, continuously referring to FIG. 4, a first patterned mask layer 201 is formed on a surface of the dielectric layer 102. The first patterned mask layer 201 has an annular opening 202, and the opening 202 defines a shape and a position of an annular trench 203.

Figure 6:
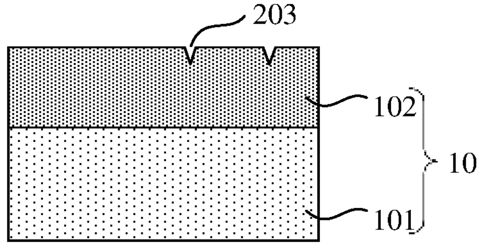
FIG. 6 shows a schematic cross-sectional structural diagram of a structure obtained after S203 in a method for manufacturing a semiconductor structure provided in one embodiment of embodiments of the disclosure.

At S202, referring to FIG. 6, the dielectric layer 102 is etched based on the first patterned mask layer 201 to form the annular trench 203 in the dielectric layer 102.

At S203, continuously referring to FIG. 6, the first patterned mask layer 201 is removed.

Figure 7:
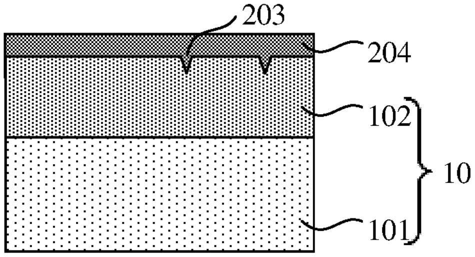
FIG. 7 shows a schematic cross-sectional structural diagram of a structure obtained after S204 in a method for manufacturing a semiconductor structure provided in one embodiment of embodiments of the disclosure.

At S204, referring to FIG. 7, a sacrificial material layer 204 is formed on the surface of the dielectric layer 102. The sacrificial material layer 204 fills up the annular trench 203 and covers the surface of the dielectric layer 102.

Figure 8:
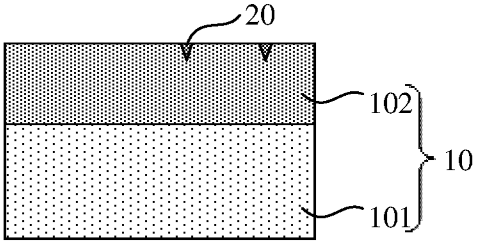
FIG. 8 shows a schematic cross-sectional structural diagram of a structure obtained after S205 in a method for manufacturing a semiconductor structure provided in one embodiment of embodiments of the disclosure.

At S205, referring to FIG. 8, the sacrificial material layer 204 that covers the surface of the dielectric layer 102 is removed. The sacrificial material layer 204 retained in the annular trench 203 forms the annular sacrificial blocking layer 20.

Figure 9:
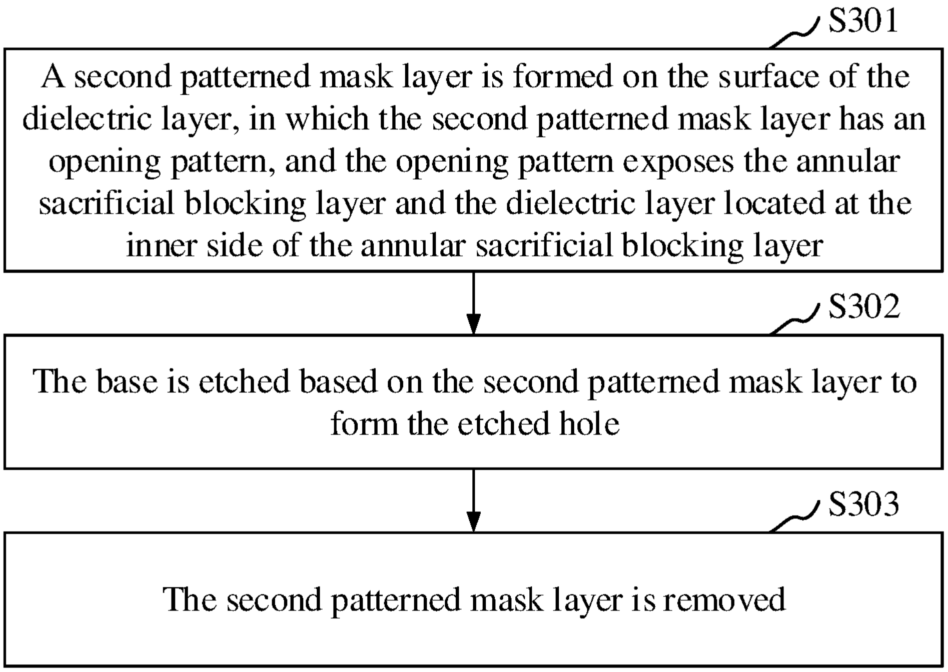
FIG. 9 shows a flowchart of S30 in a method for manufacturing a semiconductor structure provided in one embodiment of embodiments of the disclosure.

For S30, referring to FIG. 9, as an example, S30 may include the following operations.

Figure 10:
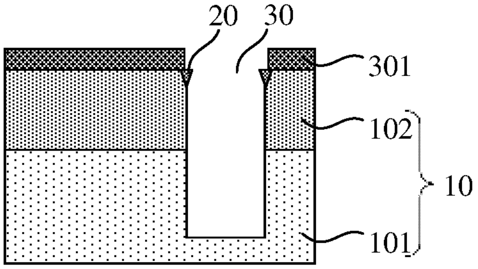
FIG. 10 shows a schematic cross-sectional structural diagram of a structure obtained after S302 in a method for manufacturing a semiconductor structure provided in one embodiment of embodiments of the disclosure.

At S301, referring to FIG. 10, a second patterned mask layer 301 is formed on the surface of the dielectric layer 102. The second patterned mask layer 301 has an opening pattern (not shown in FIG. 10), the opening pattern exposes the annular sacrificial blocking layer 20 and the dielectric layer 102 located at the inner side of the annular sacrificial blocking layer 20.

At S302, continuously referring to FIG. 10, the base 10 is etched based on the second patterned mask layer 301 to form an etched hole 30.

Figure 11:
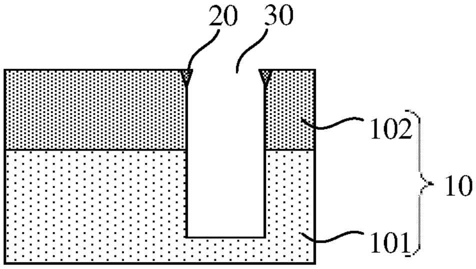
FIG. 11 shows a schematic cross-sectional structural diagram of a structure obtained after S303 in a method for manufacturing a semiconductor structure provided in one embodiment of embodiments of the disclosure.

At S303, referring to FIG. 11, the second patterned mask layer 301 is removed.

Figure 12:
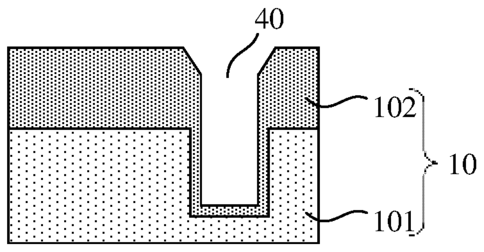
FIG. 12 shows a schematic cross-sectional structural diagram of a structure obtained after S40 in a method for manufacturing a semiconductor structure provided in one embodiment of embodiments of the disclosure.

At S40, referring to FIG. 12, the annular sacrificial blocking layer 20 is removed to obtain an interconnecting hole 40. Specifically, the width of the upper part of the interconnecting hole 40 is greater than the width of the lower part of the interconnecting hole 40.

Implementations that the upper part of the interconnecting hole 40 is greater than the width of the lower part thereof are not specifically limited in the embodiments of the disclosure, and a sidewall of the upper part of the interconnecting hole 40 may include, but is not limited to a sloping sidewall, an arcuate sidewall, a zigzag sidewall, or the like.

As an example, the sidewall of the upper part of the interconnecting hole 40 is a sloping sidewall.

Specifically, by setting the sidewall of the upper part of the interconnecting hole 40 as a sloping sidewall, the angle of arrival at the edge of the interconnecting hole 40 can be larger, which is more beneficial to forming an interconnecting structure without a void.

It can be understood that the sloping angle of the sloping sidewall is not specifically limited in the embodiments of the disclosure. As an example, an angle between the sidewall of the upper part of the interconnecting hole 40 and the upper surface of the base 10 is 60 degrees to 80 degrees, for example, 60 degrees, 65 degrees, 70 degrees, 75 degrees, 80 degrees, or the like. It should be noted that the above values are exemplary only and the sloping angle of the sloping sidewall in an actual embodiment is not limited to the above values.

As an example, continuously referring to FIG. 3, the method may further include the following operation after S40.

At S60, a conductive structure 60 is formed in the interconnecting hole 40. The conductive structure 60 fills up the interconnecting hole 40.

As an example, continuously referring to FIG. 3, the method may further include the following operation before S60.

At S50, continuously referring to FIG. 12, a pad oxide layer 50 is formed at least on the sidewall and the bottom of the interconnecting hole 40. On this basis, the conductive structure 60 may be located on the surface of the pad oxide layer 50.

Specifically, by forming the pad oxide layer 50 on the sidewall and the bottom of the interconnecting hole 40, the pad oxide layer 50 can protect the surface of the base 10 in the subsequent process and prevent the surface of the base 10 from being damaged by an etching process. Moreover, the pad oxide layer 50 can also play an isolation role between a layer formed subsequently and the base 10, avoiding the direct contact between the layer formed subsequently and the surface of the base 10, thereby providing a good surface for the formation of another layer formed subsequently and reducing the production of dislocation defects in the base 10.

The material and the structure of the pad oxide layer 50 are not specifically limited in the embodiments of the disclosure, and the pad oxide layer 50 may include but is not limited to an oxide layer such as a silicon oxide layer. In addition, the forming manner of the pad oxide layer 50 is not specifically limited in the embodiments of the disclosure, may include but is not limited to a process of chemical vapor deposition, physical vapor deposition, atomic layer deposition, thermal oxidation, or the like.

Figure 13:
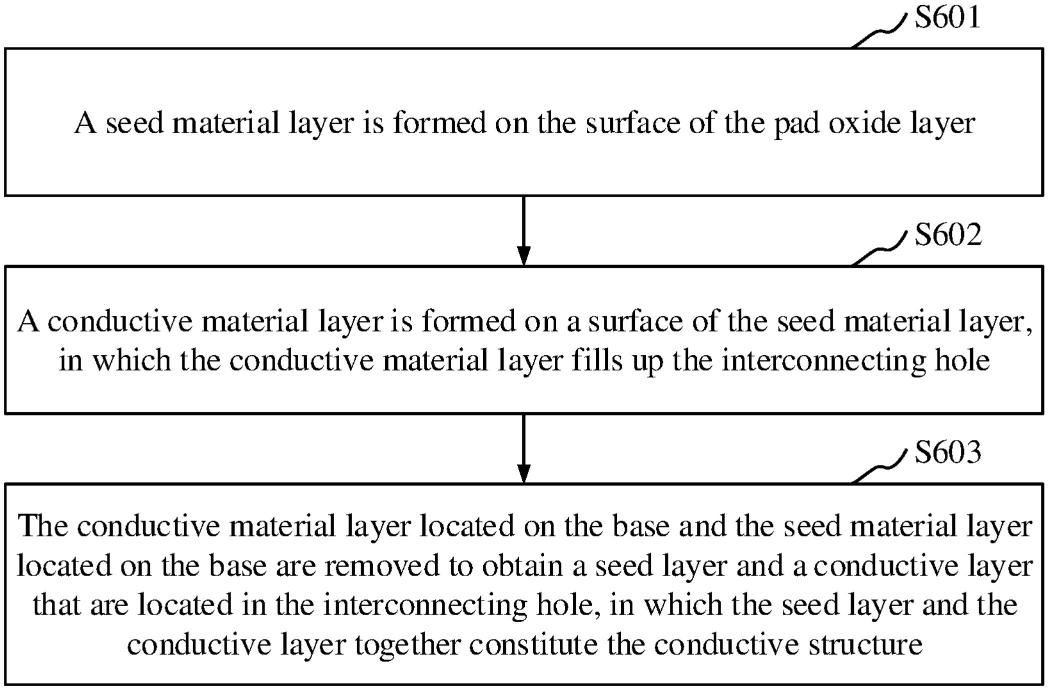
FIG. 13 shows a flowchart of S60 in a method for manufacturing a semiconductor structure provided in one embodiment of embodiments of the disclosure.

For S60, referring to FIG. 13, as an example, S60 may include the following operations.

Figure 14:
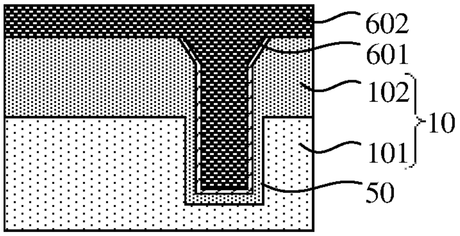
FIG. 14 shows a schematic cross-sectional structural diagram of a structure obtained after S602 in a method for manufacturing a semiconductor structure provided in one embodiment of embodiments of the disclosure.

At S601, referring to FIG. 14, a seed material layer 601 is formed on the surface of the pad oxide layer 50.

At S602, continuously referring to FIG. 14, a conductive material layer 602 is formed on the surface of the seed material layer 601. The conductive material layer 602 fills up the interconnecting hole 40.

Figure 15:
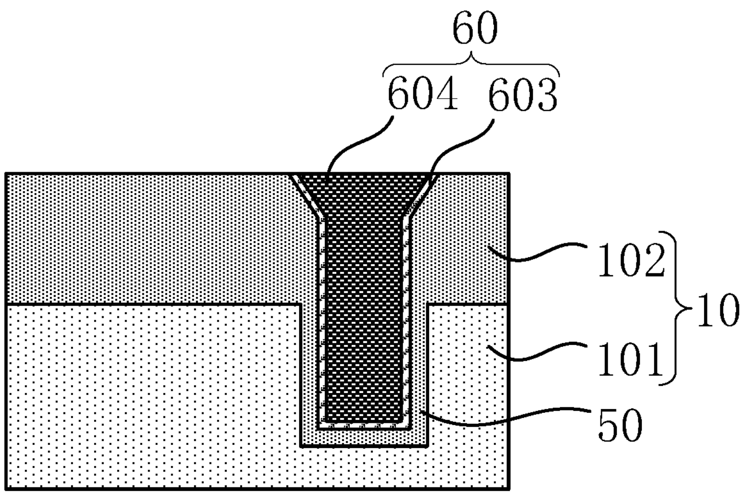
FIG. 15 shows a schematic cross-sectional structural diagram of a structure obtained after S603 in a method for manufacturing a semiconductor structure provided in one embodiment of embodiments of the disclosure.
Figure 16:
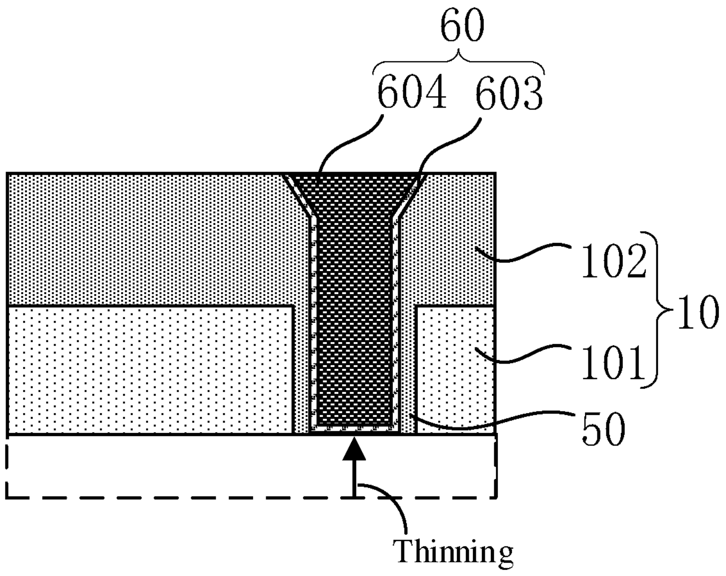
FIG. 16 shows a schematic cross-sectional structural diagram of a structure obtained after "an operation of thinning a back surface of the base until the conductive structure is exposed" (thinning) in a method for manufacturing a semiconductor structure provided in one embodiment of embodiments of the disclosure.

At S603, referring to FIG. 15, the conductive material layer 602 located on the base 10 and the seed material layer 601 located on the base 10 are removed to obtain a seed layer 603 and a conductive layer 604 that are located in the interconnecting hole 40. The seed layer 603 and the conductive layer 604 together constitute the conductive structure 60.

It will be understood that the material of the conductive material layer 602 and the material of the conductive layer 604 are not specifically limited in the embodiments of the disclosure. Each of the material of the conductive material layer 602 and the material of the conductive layer 604 may include but is not limited to at least one of platinum (Pt), gold (Au), copper (Cu), titanium (Ti), tungsten (W) or the like. As an example, the conductive material layer 602 includes a copper layer, and on this basis, the conductive layer 604 also includes a copper layer. Choosing copper as a conductive material can not only reduce the cost, but also be well compatible with the existing process, thus simplifying the process.

As an example, the manufacturing method may further include an operation of thinning a back surface of the base 10 after S60. The back surface of the base 10 can be thinned until the conductive structure 60 is exposed to form a conductive interconnecting structure.

Embodiments of the disclosure provide a semiconductor structure. Continuously referring to FIG. 15, the semiconductor structure may include a base 10 and an interconnecting hole 40 (not shown in FIG. 15). The interconnecting hole 40 is located in the base 10, and a width of an upper part of the interconnecting hole 40 is greater than a width of a lower part of the interconnecting hole 40.

Specifically, as the width of the upper part of the interconnecting hole is greater than the width of the lower part of the interconnecting hole, an opening of such an interconnecting hole can avoid being prematurely sealed when filling with a conductive layer in the subsequent process, thereby obtaining a conductive structure without a void.

Implementations that the upper width of the interconnecting hole 40 is greater than the lower width thereof are not specifically limited in the embodiments of the present disclosure, and a sidewall of the upper part of the interconnecting hole 40 may include, but is not limited to a sloping sidewall, an arcuate sidewall, a zigzag sidewall, or the like.

As an example, continuously referring to FIG. 15, the sidewall of the upper part of the interconnecting hole 40 is the sloping sidewall.

Specifically, by setting the sidewall of the upper part of the interconnecting hole 40 as an sloping sidewall, an angle of arrival of an edge of the interconnecting hole 40 can be made larger, which is more beneficial to forming an interconnecting structure without a void.

It can be understood that a sloping angle of the sloping sidewall is not specifically limited in the embodiments of the disclosure. As an example, an angle between the sidewall of the upper part of the interconnecting hole 40 and an upper surface of the base 10 is 60 degrees to 80 degrees, for example, 60 degrees, 65 degrees, 70 degrees, 75 degrees, 80 degrees, or the like. It should be noted that the above values are for example only and the sloping angle of the sloping sidewall in an actual embodiment is not limited to the above values.

As an example, continuously referring to FIG. 15, the base 10 may include a substrate 101 and a dielectric layer 102 located on a surface of the substrate 101. On this basis, the interconnecting hole 40 can penetrate through the dielectric layer 102 and extend into the substrate 101.

As an example, continuously referring to FIG. 15, the semiconductor structure may also include a conductive structure 60. Specifically, the conductive structure 60 fills up the interconnecting hole 40.

As an example, the conductive structure 60 may penetrate through the base 10 to form a conductive interconnecting structure.

For the conductive structure 60, continuously referring to FIG. 15, as an example, the conductive structure 60 may include a seed layer 603 and a conductive layer 604. The seed layer 603 is located on a surface of a pad oxide layer 50. The conductive layer 604 is located on a surface of the seed layer 603 and fills up the interconnecting hole 40.

It will be understood that a material of the conductive layer 604 is not specifically limited in the embodiments of the disclosure. The material of the conductive layer 604 may include, but is not limited to at least one of platinum (Pt), gold (Au), copper (Cu), titanium (Ti), tungsten (W), or the like. As an example, the conductive layer 604 includes a copper layer. Choosing copper as a conductive material can not only reduce the cost, but also is well compatible with the existing process, thus simplifying the process.

As an example, continuously referring to FIG. 15, the semiconductor structure may also include the pad oxide layer 50. The pad oxide layer 50 is located at least between the conductive structure 60 and the base 10.

Specifically, as the pad oxide layer 50 is set between the conductive structure 60 and the base 10, the pad oxide layer 50 can protect the surface of the base 10 in the subsequent process and prevent the surface of the base 10 from being damaged by an etching process. Moreover, the pad oxide layer 50 can also play an isolation role between a layer formed subsequently and the base 10, avoiding the direct contact between the layer formed subsequently and the surface of the base 10, thereby providing a good surface for the formation of another layer formed subsequently and reducing the production of dislocation defects in the base 10.

The material and the structure of the pad oxide layer 50 are not specifically limited in the embodiments of the disclosure, and may include but are not limited to an oxide layer such as a silicon oxide layer, or a silicon nitride layer.

It should be understood that, although the operations in the flowcharts of FIGS. 3, 5, 9, and 13 are shown in sequence as indicated by arrows, these operations are not necessarily performed in sequence as indicated by the arrows. Unless otherwise explicitly stated herein, there are no strict sequential restrictions on these operations, and these operations can be performed in other orders. Furthermore, at least part of the operations in FIG. 3, FIG. 5, FIG. 9 and FIG. 13 may include a plurality of sub-operations or a plurality of phases, which are not necessarily completed at the same time, and may be performed at different times, and the sub-operations or phases is not necessarily performed in sequence, and may be performed alternately or alternately with other operations or at least part of sub-operations or phases of the other operations.

Each embodiment in the specification is described in a progressive manner and each embodiment focuses on the differences from other embodiments, so the same and similar parts between the embodiments may be referred to each other.

The technical features of the above-described embodiments may be arbitrarily combined, and not all possible combinations of the technical features in the above-described embodiments are described for the sake of concise description. However, as long as there is no contradiction in the combinations of these technical features, they should be considered to belong to the scope of the specification.

The above-described embodiments are merely illustrative of several embodiments of the disclosure and the description thereof is more specific and detailed, but cannot therefore be construed as limitations to the scope of the application. It should be noted that a number of variations and modifications may be made to those of ordinary skill in the art without departing from the concept of the embodiments of the disclosure, and those fall within the scope of protection of the embodiments of the disclosure. Therefore, the scope of protection of the embodiment of the disclosure shall be subject to the appended claims.

The invention claimed is:

1. A method for manufacturing a semiconductor structure, comprising:

providing a base;

forming an annular sacrificial blocking layer in the base;

forming an etched hole in the base, the etching hole being located at an inner side of the annular sacrificial blocking layer; and removing the annular sacrificial blocking layer to obtain an interconnecting hole, a width of an upper part of the interconnecting hole being greater than a width of a lower part of the interconnecting hole;

wherein the base comprises a substrate and a dielectric layer located on a surface of the substrate; and forming the annular sacrificial blocking layer in the base comprises:

forming a first patterned mask layer on a surface of the dielectric layer, the first patterned mask layer having an annular opening, and the annular opening defining a shape and a position of an annular trench;

etching the dielectric layer based on the first patterned mask layer to form the annular trench in the dielectric layer;

removing the first patterned mask layer;

forming a sacrificial material layer on the surface of the dielectric layer, the sacrificial material layer filling up the annular trench and covering the surface of the dielectric layer; and removing the sacrificial material layer covering the surface of the dielectric layer, such that the sacrificial material layer retained in the annular trench forms the annular sacrificial blocking layer;

wherein forming the etched hole in the base comprises:

forming a second patterned mask layer on the surface of the dielectric layer, the second patterned mask layer having an opening pattern, and the opening pattern exposes the annular sacrificial blocking layer and the dielectric layer located at the inner side of the annular sacrificial blocking layer;

etching the base based on the second patterned mask layer to form the etched hole; and removing the second patterned mask layer.

2. The method according to claim 1, wherein a sidewall of the upper part of the interconnecting hole is a sloping sidewall.

3. The method according to claim 2, wherein an angle between the sidewall of the upper part of the interconnecting hole and an upper surface of the base is 60 degrees to 80 degrees.

4. The method according to claim 1, wherein the method further comprises: after removing the annular sacrificial blocking layer to obtain the interconnecting hole, forming a conductive structure in the interconnecting hole, the conductive structure filling up the interconnecting hole.

5. The method according to claim 4, wherein the method further comprises: before forming the conductive structure in the interconnecting hole, forming a pad oxide layer at least on a sidewall and a bottom of the interconnecting hole, the conductive structure being located on a surface of the pad oxide layer.

6. The method according to claim 5, wherein the pad oxide layer is further located on a surface of the base, and forming the conductive structure in the interconnecting hole comprises:

forming a seed material layer on the surface of the pad oxide layer;

forming a conductive material layer on a surface of the seed material layer, the conductive material layer filling up the interconnecting hole; and removing the conductive material layer located on the base and the seed material layer located on the base to obtain a seed layer and a conductive layer that are located in the interconnecting hole, the seed layer and the conductive layer together constituting the conductive structure.

7. A method for manufacturing a semiconductor structure, comprising:

providing a base;

forming an annular sacrificial blocking layer in the base;

forming an etched hole in the base, the etching hole being located at an inner side of the annular sacrificial blocking layer; and removing the annular sacrificial blocking layer to obtain an interconnecting hole, a width of an upper part of the interconnecting hole being greater than a width of a lower part of the interconnecting hole;

wherein the method further comprises: after removing the annular sacrificial blocking layer to obtain the interconnecting hole, forming a conductive structure in the interconnecting hole, the conductive structure filling up the interconnecting hole;

wherein the method further comprises: before forming the conductive structure in the interconnecting hole, forming a pad oxide layer at least on a sidewall and a bottom of the interconnecting hole, the conductive structure being located on a surface of the pad oxide layer; and wherein the method further comprises: after forming the conductive structure in the interconnecting hole, thinning a back surface of the base until the conductive structure is exposed to form a conductive interconnecting structure.

* * * * *